(12) United States Patent
Stewart et al.

(10) Patent No.: US 7,079,996 B2
(45) Date of Patent: Jul. 18, 2006

(54) SYSTEM AND METHOD FOR DESIGN OF EXPERIMENTS USING DIRECT SURFACE MANIPULATION OF A MESH MODEL

(75) Inventors: Paul Joseph Stewart, Ann Arbor, MI (US); Pietro Buttolo, Dearborn, MI (US); Yifan Chen, Ann Arbor, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 693 days.

(21) Appl. No.: 09/681,732

(22) Filed: May 30, 2001

(65) Prior Publication Data

US 2002/0183986 A1 Dec. 5, 2002

(51) Int. Cl.
*G06G 7/48* (2006.01)

(52) U.S. Cl. .................. 703/8; 345/419; 345/619; 345/649

(58) Field of Classification Search ............ 703/8; 700/98, 182; 715/964; 345/419, 619, 649
See application file for complete search history.

(56) References Cited

U.S. PATENT DOCUMENTS

| | | | | |
|---|---|---|---|---|
| 4,821,214 A | * | 4/1989 | Sederberg | 345/420 |
| 5,119,309 A | * | 6/1992 | Cavendish et al. | 700/182 |
| 5,179,644 A | * | 1/1993 | Chiyokura et al. | 345/441 |
| 5,253,331 A | * | 10/1993 | Lorenzen et al. | 706/45 |
| 5,459,382 A | * | 10/1995 | Jacobus et al. | 318/568.11 |
| 5,504,845 A | * | 4/1996 | Vecchione | 345/419 |
| 5,731,816 A | * | 3/1998 | Stewart et al. | 345/419 |
| 5,734,364 A | * | 3/1998 | Hirai et al. | 345/95 |
| 5,757,649 A | * | 5/1998 | Kato | 700/182 |
| 5,903,458 A | * | 5/1999 | Stewart et al. | 700/98 |
| 5,923,573 A | * | 7/1999 | Hatanaka | 703/2 |
| 5,999,187 A | * | 12/1999 | Dehmlow et al. | 345/420 |
| 6,036,345 A | * | 3/2000 | Jannette et al. | 700/97 |
| 6,084,590 A | * | 7/2000 | Robotham et al. | 345/419 |
| 6,262,738 B1 | * | 7/2001 | Gibson et al. | 345/419 |
| 6,510,241 B1 | * | 1/2003 | Vaillant et al. | 382/154 |
| 6,668,206 B1 | * | 12/2003 | Akaike et al. | 700/98 |

(Continued)

OTHER PUBLICATIONS

Duane et al., "DOE/Opt: A system for Design of Experiments, Response Surface Modeling and Optimization Using Process and Device Simulation" 1993. p. 1-4.*

(Continued)

*Primary Examiner*—Paul L. Rodriguez
*Assistant Examiner*—Tom Stevens
(74) *Attorney, Agent, or Firm*—David B. Kelley; Damel H. Bliss

(57) ABSTRACT

A system and method for design of experiments (DOE) using direct surface manipulation of a mesh model. The method includes the steps of selecting a geometric model in a computer-aided design (CAD) format, converting the geometric model into a mesh model and evaluating the mesh model using a computer-aided engineering (CAE) analysis. The method also includes the steps of determining whether to continue generating the design of experiments response, and modifying a surface of the mesh model by varying a predetermined parameter, wherein the surface is modified using direct surface manipulation (DSM), the mesh model is updated and the updated mesh model is used in continuing generating the design of experiments response, if determined to continue the design of experiments. The method further includes the steps of using the results of the CAE analysis for the design of experiments.

13 Claims, 4 Drawing Sheets

U.S. PATENT DOCUMENTS

| | | | |
|---|---|---|---|
| 6,704,693 B1 * | 3/2004 | Fan et al. | 703/1 |
| 2002/0133264 A1 * | 9/2002 | Maiteh et al. | 700/182 |
| 2002/0163497 A1 * | 11/2002 | Cunningham et al. | 345/156 |

OTHER PUBLICATIONS

Chen et al., "A Real-Time, Interactive Method for Fast Modification of Large-Scale CAE Mesh Models" 2000. p. 1-8.*

Purschke et al., "Virual Reality—New Methods for Improving and Accelerating the Development Process in Vehicle Styling and Design" IEEE Jun. 1998. p. 1-11.*

Chen et al. IMF 1.0 User Manual Project No. AJ499 Ford Research Laboratory Oct. 26, 1999. p. 1-14.*

Smid et al., "Human Integration in Simulation" IEEE 1998 p. 554-558.*

Narinder-N, DENEB/ERGO—A simulation-based Human Factors Tool, 1995, Proceedings of the Winter Simulation Conference. p. 427-431.*

Donald-D. A Tutorial on Ergonomic and Process Modeling Using Quest and IGRIP. 1998 p. 297-302.*

PJ. Stewart "Direct Shape Control of Free-Form Curves and Surfaces with Generalized Basis Functions" PhD Dissertation, Univ of Michigan p. 1-237. 1991.*

Kaira et al., "Real-Time Animation of Realistic Virtual Humans" Sep./Oct. 1998 IEEE p. 42-56.*

Nobel et al., "Direct Manipulation of Surfaces Using NURBS-based Free-Form Deformations" 1999 IEEE p. 238-243.*

Duane S. Boning and P. K. Mozumder, "DOE/Opt: A system For Design Of Experiements, Response Surface Modeling, and Optimization Using Process And Device Simulation", Semiconductor Process and Design Center, Dec. 7, 1993, p. 1-5.

Yifan Chen, Paul Stewart and, Pietro Buttolo, "A Real-Time, Interactive Method For Fast Modification Of Large-Scale CAE Mesh Models", ASME 2000 Design Engineering Technical Conferences and Computers and Information in Engineering Conference, Sep. 10-13, 2000. p. 1-8.

Purschke-F et al. :Viurtual Reality-New Methods for Improving and Accelerating the Development Process in Vehicle Styling and Design IEEE document via Computer Graphics International Jun. 1998, p. 1-11.

Smid et al., "Human Integration in Simulation" IEEE 1998 pp. 554-558.

Narinder Nayar, DENEB/ERGO—A Simulation-Based Human Factors Tool, 1995, Proceedings of the Winter Simulation Conference, pp. 427-431.

Deidre L. Donald, A Tutorial on Ergonomic and Process Modeling Using Quest and IGRIP, 1998, Proceedings of the 1998 Winter Simulation Conference, pp. 297-302.

P.J. Stewart, "Direct Shape Control Of Free-Form Curves And Surfaces With Generalized Basis Functions", Ph.D. dissertation, Department of Naval Architecture and Marine Engineering, University of Michigan, 1991, 237 pages.

* cited by examiner

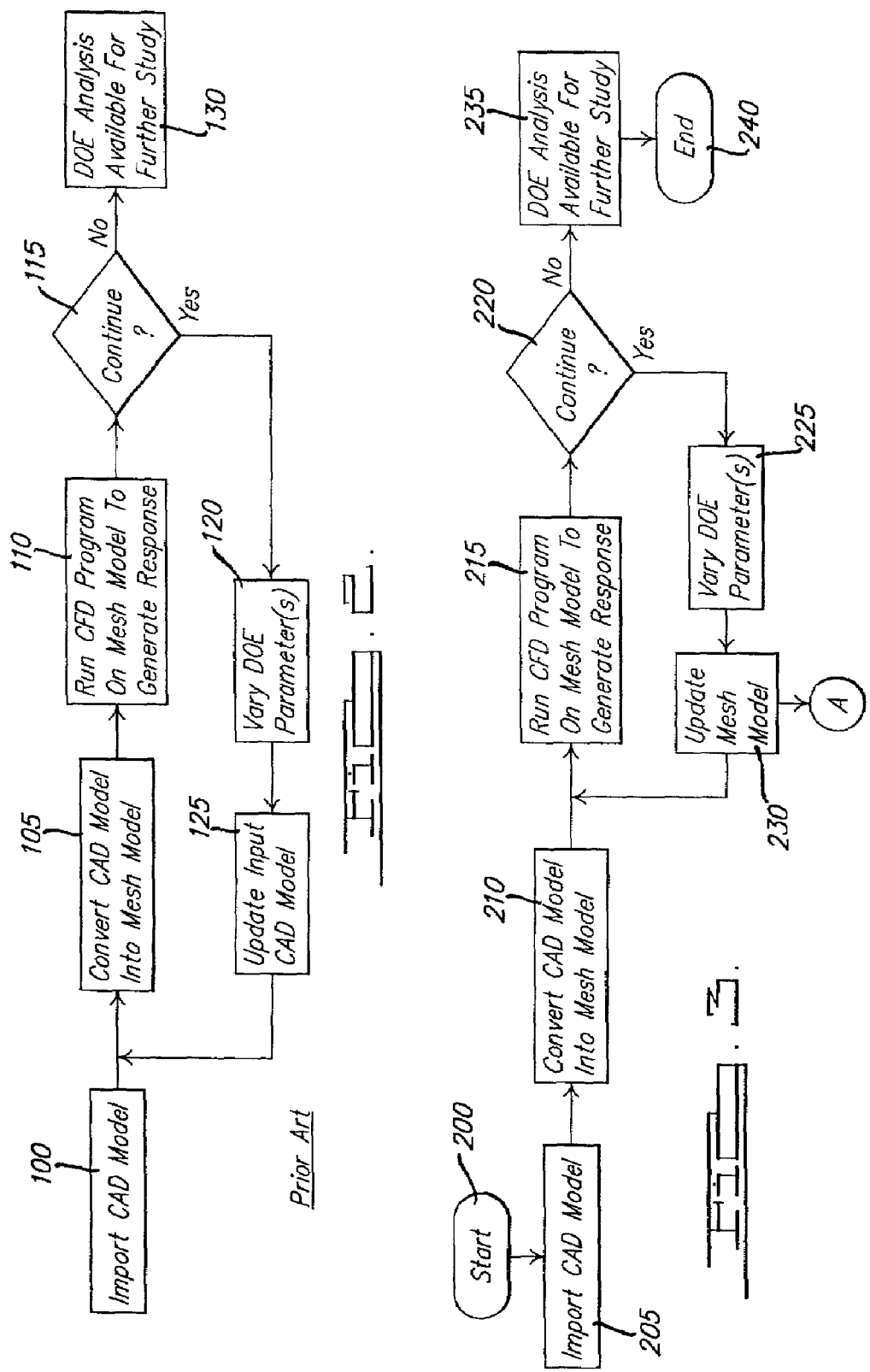

SYSTEM AND METHOD FOR DESIGN OF EXPERIMENTS USING DIRECT SURFACE MANIPULATION OF A MESH MODEL

BACKGROUND OF INVENTION

The present invention relates generally to computer-assisted design of vehicles and, more specifically, to a system and method for design of experiments using direct surface manipulation of a mesh model in the computer-assisted design of a vehicle.

Vehicle design, and in particular the design of an automotive vehicle, has advanced to a state in which computer-assisted design techniques are frequently incorporated in the development of a new vehicle or redesign of an existing vehicle. Enhanced visualization software tools allow for interactive display and manipulation of large geometric models, including models developed using computer aided design (CAD). In the field of vehicle design, the use of computer aided design and visualization techniques are especially beneficial in designing, packaging, and assembling the various systems incorporated within the vehicle to maximize the design and functional capabilities of these vehicles. Advantageously, potential vehicle system designs can be considered in a timely and cost-effective manner by analyzing a digital representation of a proposed design versus preparing an actual vehicle model.

One aspect of the design process is to construct a geometric model of the proposed design using a technique known as computer-aided design (CAD). Another aspect of the design process is the use of mathematical tools referred to as computer-aided engineering (CAE) to constrain and guide the designer in evaluating the design. The use of CAE allows for verification of design intent and a prediction of a mechanical behavior of the design, including its systems, subsystems, and components. Examples of CAE techniques include finite element analysis (FEA) and computational fluid dynamics (CFD). Advantageously, the increased computing power of modern computers has reduced the amount of time required to perform a CAE simulation. Therefore, CAE tools can be utilized earlier in the product development process and applied to a wide range of product development activities.

One product development activity that has benefited from enhanced CAE computational capabilities is Design of Experiments (DOE). DOE is an engineering design practice that enables a designer to conduct a series of tests corresponding to variations in a set of predetermined design parameters. One benefit of a DOE simulation is that a test in the past would require a physical experiment on a physical prototype, which can now be performed using a CAE simulation and a mathematical or computer representation of a geometric model. As such, the DOE can be conducted in an early phase of the product development process and proposed modifications to the design can be expeditiously analyzed.

With respect to the design of the exterior shape of a vehicle, an airflow DOE provides aerodynamic information regarding the exterior shape of the vehicle. CFD is used to calculate aerodynamic properties, ranging from drag and lift coefficients to wind-noise characteristics, in response to a set of vehicle exterior shape parameters. Since the CFD simulation uses a mathematical representation of the geometric model of the vehicle, the airflow DOE can be performed early in the design process before a physical prototype is built.

Currently, the DOE process includes the steps of importing a CAD model of a particular design such as the exterior shape of the vehicle. The CAD model is converted into a mesh model and the CFD analysis is performed on the mesh model to generate a response of the CAD system. Based on the response obtained in the CFD analysis, the predetermined DOE parameters can be modified. The CAD model is updated in light of the modified DOE parameters. However, modifying the CAD model in a CAD system is a more time-consuming task that has to be performed each time a change is made to the DOE parameter set. Also, using a CAD system to update the mesh model is a time consuming and costly process. Thus, there is a need in the art for a system and method of direct modification of a mesh model based on DOE parameters using direct surface modeling to eliminate the need to update the CAD model each time a DOE parameter is modified.

SUMMARY OF INVENTION

Accordingly, the present invention is a system and method for design of experiments (DOE) using direct surface manipulation of a mesh model. The system includes a computer system having a memory, a processor, a user input device and a display device. The system also includes a computer generated geometric model stored in the memory of the computer system, wherein the model is in a computer-aided design (CAD) format. A user uses the computer system for a design of experiments on the geometric model by converting the geometric model into a mesh model, evaluating the mesh model using a computer-aided engineering (CAE) analysis, modifying a surface of the mesh model by varying a predetermined parameter. The surface is modified using direct surface manipulation of the surface of the mesh model and the updated mesh model is used in the design of experiments.

The method includes the steps of selecting a geometric model in a computer-aided design (CAD) format, converting the geometric model into a mesh model, and evaluating the mesh model using a computer-aided engineering (CAE) analysis. The method also includes the steps of determining whether to continue the design of experiments and modifying a surface of the mesh model by varying a predetermined parameter. The surface is modified using direct surface manipulation (DSM). The mesh model is updated and the updated mesh model is used in continuing generating the design of experiments response if determined to continue generating the design of experiments response. The method further includes the steps of using the results of the CAE analysis for the design of experiments.

One advantage of the present invention is that a system and method for design of experiments using direct surface manipulation of a mesh model is provided that provides for verification of design intent and prediction of model behavior early in the design process. Another advantage of the present invention is that a system and method is provided that replaces a physical experiment on a physical prototype with a computer aided engineering simulation using a computer model. Yet another advantage of the present invention is that the Design of Experiment parameters can be expeditiously modified and analyzed. A further advantage of the present invention is that the mesh model is updated using Direct Surface Manipulation after a DOE parameter is varied, instead of updating the CAD model and converting the updated CAD model to a mesh model.

Other features and advantages of the present invention will be readily appreciated, as the same becomes better understood, after reading the subsequent description taken in conjunction with the accompanying drawings.

BRIEF DESCRIPTION OF DRAWINGS

FIG. 2 is a flowchart a prior art method of conducting a design of experiments.

FIG. 3 is a flowchart of a method, according to the present invention, for design of experiments using direct surface manipulation of a mesh model using the system of FIG. 1.

FIG. 6 is a flowchart of another embodiment, according to the present invention, of a method of direct surface manipulation of a mesh model using an automatic DOE model generator.

DETAILED DESCRIPTION

23 A design of a system, such as a vehicle, is achieved according to the present invention with a generic, parametric driven design process. Advantageously, this process allows for flexibility in vehicle design and engineering analysis of the design in a fraction of the time required using conventional design methods. Various computer-based tools are integrated to achieve this enormous time and expense savings, including solid modeling, parametric design, and automated studies.

In one embodiment, the computer generated geometric model represents a design form for a vehicle (not shown). The vehicle design form is typically generated using conventional computer aided design (CAD) including computer aided manufacturing (CAM) and computer aided engineering (CAE) techniques.

Figure 1:
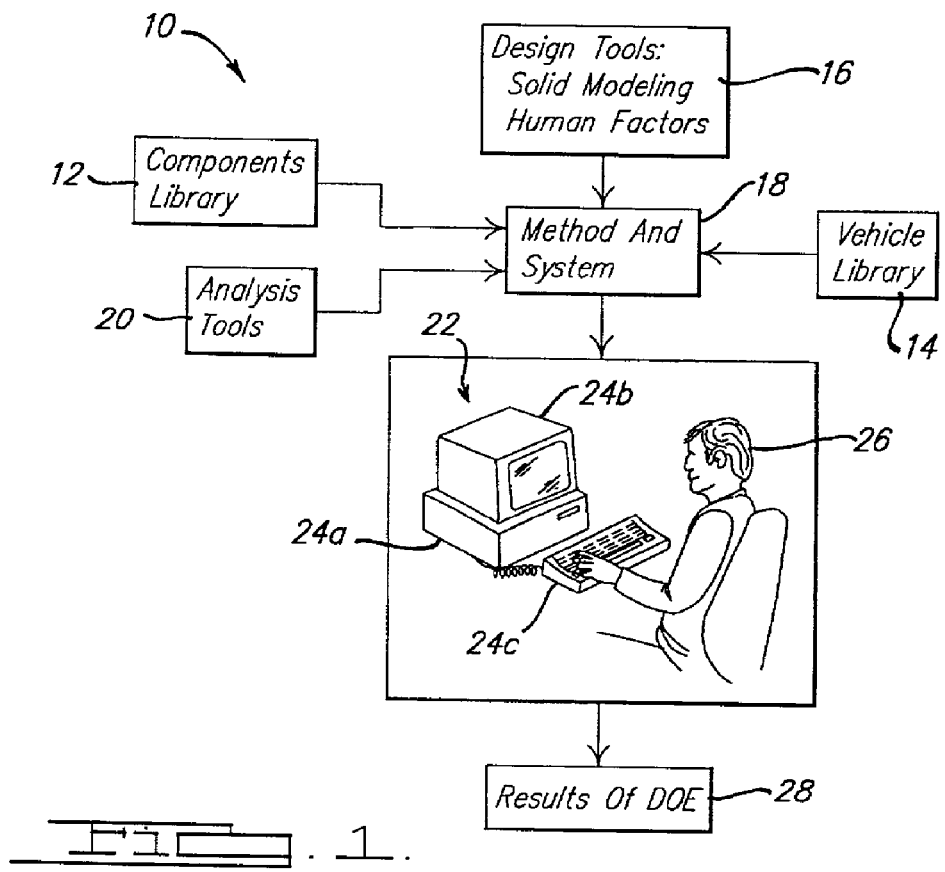
FIG. 1 is a diagrammatic view of a system for use in conjunction with a method, according to the present invention, for design of experiments using direct surface manipulation of a mesh model.
Figure 5:
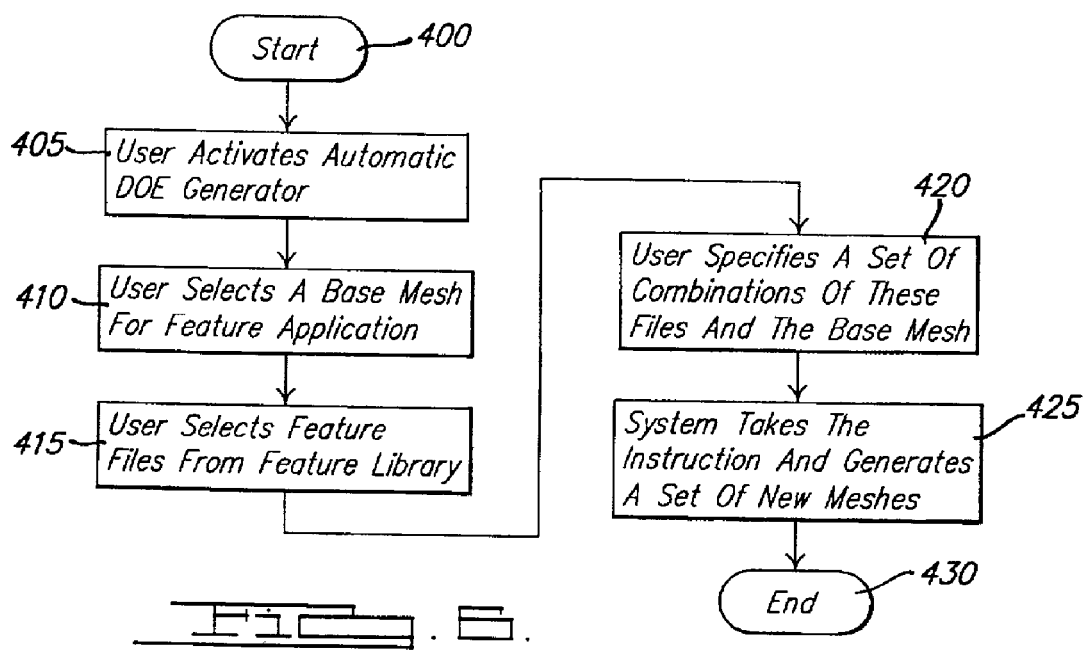
FIGS. 5a through 5e are diagrammatic views illustrating direct surface manipulation of a surface, according to the method of FIG. 4.

Referring to the drawings and in particular to FIG. 1, one embodiment of a system 10 for design of experiment using direct surface manipulation of a mesh model, according to the present invention, is shown. The system 10 includes a knowledge-based engineering library 12 stored on an electronic storage device (not shown) that is operatively connected to a computer system 22 to be described. The knowledge-based engineering library 12 is a database of sub-libraries containing an electronic representation of data including various experts" knowledge of information relevant to the design of a product, such as a vehicle (not shown). The knowledge-based engineering library 12 may include information such as design, assembly and manufacturing rules and guidelines. The knowledge-based engineering library 12 may also contain data in electronic form regarding various types of vehicle subsystems. The knowledge-based engineering library 12 may further contain predetermined product assumptions regarding the vehicle to be designed, such as model year, style, or production volume. The knowledge-based engineering library 12 may include a sub-library, such as a component parts library of particular component parts used on the vehicle.

The system 10 also includes a vehicle library 14 stored on the electronic storage device. The vehicle library 14 is an electrical representation of a vehicle model or a portion thereof. Advantageously, the vehicle library 14 may contain a geometric model of an exterior portion of a particular vehicle. The vehicle library 14 may include a DSM feature sub-library containing information regarding a particular DSM feature. It should be appreciated that the vehicle library 14 may be a sub-library of the knowledge-based engineering library 12.

The system 10 may also include various computer-aided design (CAD) tools 16, which can be used by the method, to be described. These design tools 16 may include solid modeling, visualization, and parametric design techniques. Solid modeling, for example, takes electronically stored vehicle model data from the vehicle library 14 and standard component parts data from the knowledge-based engineering library 12 and builds complex geometry for part-to-part or full assembly analysis. It should be appreciated that several modeling programs are commercially available and generally known to those skilled in the art.

The parametric design technique is used in the electronic construction of geometry within the computer system 22 for designing the vehicle or a portion thereof. As a particular dimension or parameter is modified, the computer system 22 is instructed to regenerate a new geometry.

The system 10 includes various computer-aided engineering (CAE) analysis tools 20. One example of a CAE analysis tool 20 is computational fluid dynamics (CFD). Another example of a CAE analysis tool 20 is finite element analysis (FEA). It should be appreciated that several software programs are commercially available to perform these analyses and are generally known to those skilled in the art.

The system 10 also includes a computer system 22 having a processor, a controller, and a memory shown at 24a to process information relevant to the a method 18, according to the present invention, for design of experiments using direct surface manipulation of a mesh model. The computer system 22 includes a display device 24b, such as a video terminal, to display a computer aided vehicle design.

In one embodiment, information is displayed on the video terminal 24b in a series of screens, also referred to as a browser. A user 26 inputs information into the computer system 22 when prompted to do so. The information may represent different parameter alternatives. The set of parameters or the set of instructions may be specific to the method 18 for design of experiments using direct surface manipulation of a mesh model, wherein other data and information non-specific to the method 18 may already be stored in the memory of the computer system 22. It should be appreciated that selection and control of the information within a screen can be achieved by the user 26, via a user interactive device 24c, such as a keyboard or a mouse as is known in the art.

One example of an input method is a drawing technique to draw a box around a local region of the model using the user interactive device 24c, such as the mouse. In one embodiment, the drawing process includes a click, drag and release of the mouse, as is known in the art. Another type of input method is a graphical user interface that allows menu selection, parameter modification and performs other types of viewing operations. Another example of an input method is a popup dialog box containing available information or instructions. Preferably, the computer system 22 provides for fast display capability for rendering and viewing of complex and large mesh models.

The computer system 22 utilizes the set of information or instructions from the user 26, information from the libraries 12, 14, design tools and analysis tools 16, 20 and any other information in carrying out the method 18, according to the present invention and discussed in detail subsequently, for design of experiments using direct surface manipulation of a mesh model.

Advantageously, this is a time and cost savings as compared to performing the same evaluation using a physical prototype. In addition, the computer-implemented method 18 for design of experiments using direct surface manipulation of a mesh model combines all of the foregoing to provide an efficient, flexible, rapid tool for evaluating the design of a vehicle. Furthermore, information obtained during the evaluation of the design is an output or result of the method 18 as shown at 28 and is available for further analysis and study.

Referring to FIG. 2, an example of a prior art design of experiments methodology is shown. The DOE process uses a CAD model for analysis purposes. In this example representing the prior art, the DOE is an airflow DOE for a vehicle, which provides a guideline for enhancing an exterior shape of the vehicle from an aerodynamic standpoint. The methodology selects a CAD model to use in the simulation as illustrated at block 100. In block 105, the CAD model is converted into a geometric model suitable for CAE analysis. An example of a geometric model is a finite element mesh model. In block 110, a computer aided engineering (CAE) analysis is performed using a predetermined set of parameters. In particular, an analytical technique referred to as computational fluid dynamics (CFD) is used to generate a response, such as vehicle drag, lift coefficients and wind noise, for a set of airflow DOE parameters, such as the windshield angle, whether or not a spoiler is placed on the decklid, and shape of the hood near the windshield.

In diamond 115, the user selects whether to continue generating the DOE response. If the user selects not to continue generating the DOE response, the DOE response is available for DOE analysis in block 130. If the user selects to continue generating the DOE response in diamond 115, a DOE parameter is modified for the particular set of DOE parameters being studied in block 120. In block 125, the CAD model is modified in light of a modified DOE parameter. It should be appreciated that the user may perform several iterations of the DOE analysis using various sets of parameters. The methodology returns to block 105 and continues the DOE process by converting the updated CAD model into a model format suitable for CAE analysis.

A disadvantage of the prior art is that the step of modifying a CAD model is costly and time consuming to process, since it must be performed each time a change is made to the set of DOE parameters. A CAD system requires a significant amount of overhead, including user time, training, and experience. The cost and time associated with having to use a CAD system to update the mesh model detracts from the advantages associated with using the DOE process.

Referring to FIG. 3, the method 18, according to the present invention, for design of experiments using direct surface manipulation of a mesh model is shown. Preferably, the use of direct mesh modeling expands and integrates a mathematical surface modeling technique referred to in the art as Direct Surface Manipulation (DSM). With DSM, an entire surface feature is placed on an existing parametric surface as a single geometric entity. After the feature is created, the user 26 can control its location, shape, and continuity independently by adjusting corresponding parameters. This methodology can be applied to allow direct modification of a CAE mesh model in response to a change made to a set of DOE parameters. The methodology starts or begins in block 200 and advances to block 205.

In block 205, the user 26 selects a geometric model for assessing its geometric properties, and the model is imported into the methodology. Preferably, the model is a computer generated, computer-aided design (CAD) model, digital buck or other mathematical or geometric representation, that is maintained in a computer database such as the vehicle library 14, as previously described. The model is represented using a standard data format, such as a set of NURBS, a three-dimensional solid CSG, or a polygonal soup. In one embodiment, the model represents a vehicle and in particular a portion of a body of the vehicle. Further, the user 26 may select a surface representing a section of the model to evaluate such as by drawing a box (not shown) around the desired section of the model to evaluate using the user interactive device 22c such as the mouse. The methodology advances to block 210.

In block 210, the methodology converts the CAD model 24 into a geometric model for analysis using the analysis tool 20. An example of a geometric model is a mesh model, whereby each point representing the model is uniquely identified by a set of coordinates within a known coordinate system. Known mesh formats include STL and NASTRAN. It should be appreciated that computer programs are commercially available for configuring a CAD model as a mesh model. It should also be appreciated that the system 10 may include another type of analysis tool 20 in the form of data manipulation software to facilitate the conversion of the CAD model into a mesh model. In addition, global and local connectivity information between mesh elements can be stored in a sub-library of the vehicle library 14 for quicker direct surface modeling feature creation and manipulation. The methodology advances to block 215.

In block 215, the methodology uses the analysis tool 20 to perform a CAE analysis using predetermined parameters to obtain a response of the system. An example of a CAE analysis is an airflow DOE using computational fluid dynamics, as previously described with respect to the prior art. Examples of DOE parameters for the CFD airflow analysis are the windshield angle, whether or not a spoiler is placed on the decklid, and shape of the hood near the windshield. Preferably, the response of the CAE analysis is provided to the user 26 in a user-defined format, such as graphically displayed on the display device 22b. The methodology advances to diamond 220.

In diamond 220, the user 26 determines whether to continue generating the DOE response. If the user 26 determines to continue the DOE analysis, the methodology advances to block 225.

In block 225, the user 26 selects a DOE parameter to modify. In one embodiment, the surface of the model contains features, such as raised sections or depressions. In particular, a feature is a self-contained geometric entity imposed on a base geometry. The DOE parameter relates to the feature and modification of the DOE parameter may affect the mathematical definition of the feature. The methodology advances to block 230.

In block 230, the methodology updates the mesh model in light of the modified DOE parameter using a mathematical surface modeling technique referred to in the art as Direct Surface Manipulation (DSM). In DSM, an entire surface feature is placed on an existing parametric surface as a single geometric entity. After the feature is created, the user 26 can intuitively control its location, shape, and continuity independently by adjusting corresponding parameters on a real-time basis. Advantageously, DSM provides for modifications to a mesh model without relying on CAD techniques.

Figure 4:
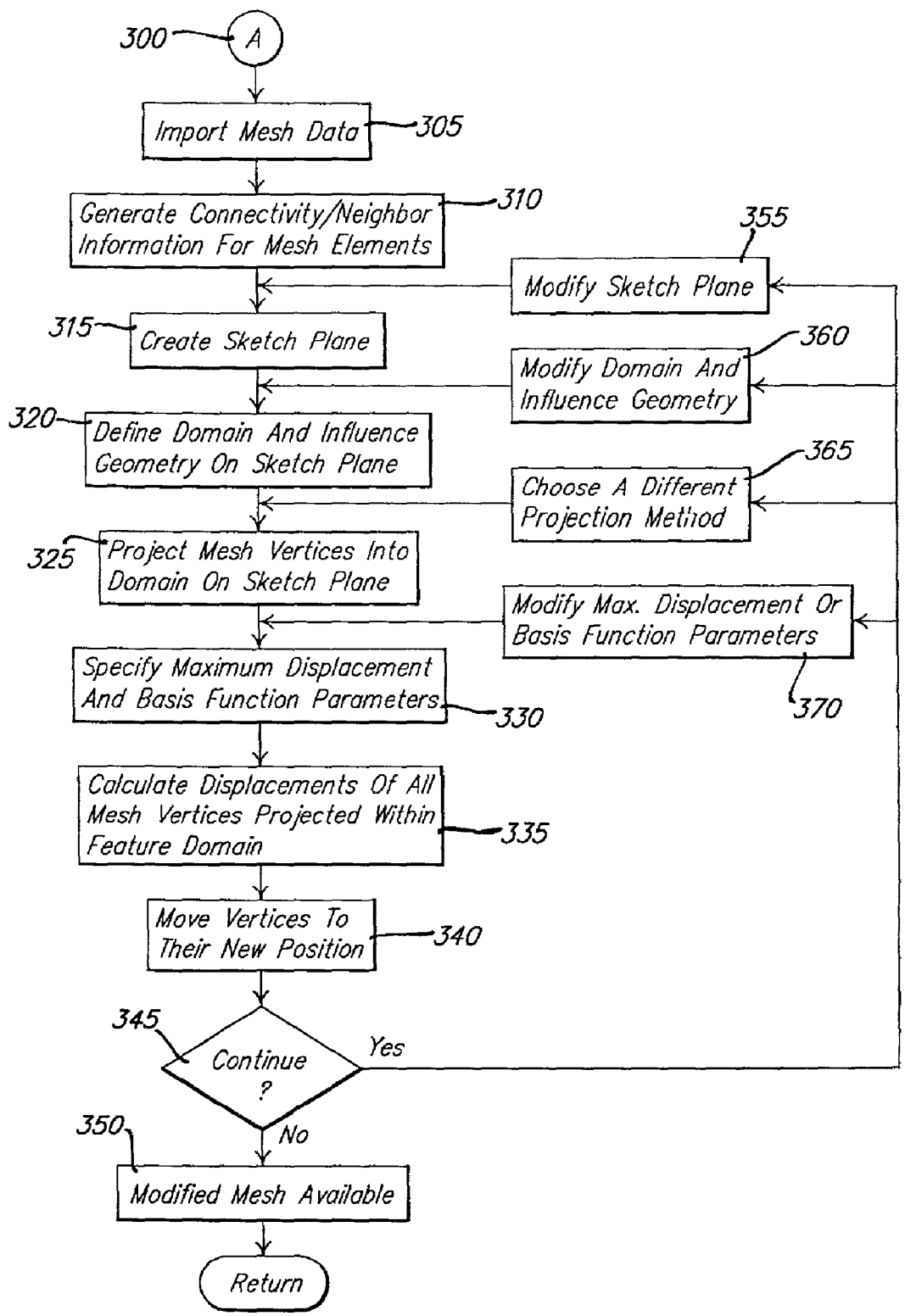
FIG. 4 is a flowchart of a method, according to the present invention, of direct surface manipulation of a mesh model for use with the method of FIG. 3.

A local region of the surface can be deformed quickly and accurately using direct surface modeling to change a predetermined DSM parameter. An example of a modifiable DSM parameter is adjusting the magnitude or height of the deformation, moving, scaling, reorienting, or adjusting the boundary of the deformed region, editing the character of the deformation by changing the underlying DSM basis function and deleting a DSM feature. One embodiment of a method, according to the present invention, for forming a mesh feature and updating a mesh model using DSM is illustrated in FIG. 4 to be described. After the mesh model is updated in block 230, the methodology returns to block 215 and continues the DOE analysis by performing the CAE analysis on the updated mesh model to generate a response.

Returning to diamond 220, if the user 26 does not elect to continue generating the DOE response, the methodology advances to block 235. In block 235, the resultant DOE responses are available for further study and evaluation. The methodology advances to bubble 240 and ends. It should be appreciated that the methodology is executable in an iterative manner, since the user 26 may elect to consider various sets of DOE parameters as part of a comprehensive DOE study.

Referring to FIG. 4, one embodiment of a method, according to the present invention, of direct surface modification is illustrated for use in updating an existing mesh model using modified DOE parameters. Advantageously, DSM allows the user 26 to quickly modify a mesh model by adding a feature to it that can be edited or relocated intuitively in real-time. In addition, a family of CAE mesh models can be derived quickly from an existing mesh model. The methodology begins in circle A shown at 300 when called for by block 230 of FIG. 3 and advances to block 305.

In block 305, the methodology imports the mesh model previously selected by the user 26. Preferably, the mesh model is a set of triangles, referred to as elements having a defined order. It should be appreciated that the mesh model is a discrete representation, while the CAD model is a continuous representation. The methodology advances to block 310.

In block 310, the methodology generates connectivity and neighbor information for each mesh element. For example, a topological structure of the mesh model can be created by organizing a list of triangles into a connected surface mesh. The mesh is a collection of polygons, which in one embodiment are triangles, describing a surface of a solid object. Preferably, the surface is divided into a large number of triangles to represent surface details with a certain degree of accuracy. Further, the size of the polygons may not be fixed within all locations on the surface of the model.

Advantageously, the methodology makes assumptions regarding the connectivity of the triangles. Thus, it is assumed that each triangle will have an inside area, neighboring triangles along its edges, and each vertex has a set of connected polygons. The methodology also assumes that each facet will have no more than three neighboring triangles, each sharing an entire edge with the facet. The methodology further relies on knowing all the triangles connected to each vertex. It should be appreciated that the model may need to be remeshed to ensure that these conditions are satisfied. The methodology advances to block 315.

Figure 5A:
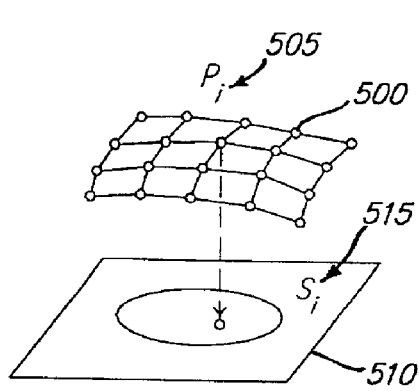

In block 315, the user 26 defines a two-dimensional workspace or sketch plane for describing a domain of a DSM feature. Preferably, the sketch plane is an analytical surface, which can be oriented relative to the mesh model after it is created. In one embodiment, the sketch plane is a plane tangential to a selected point on the mesh model. As illustrated in FIG. 5a, the mesh model is shown at 500, a selected point at 505, the sketch plane at 510, and a point projected onto the sketch plane at 515. The methodology advances to block 320.

Figure 5B:
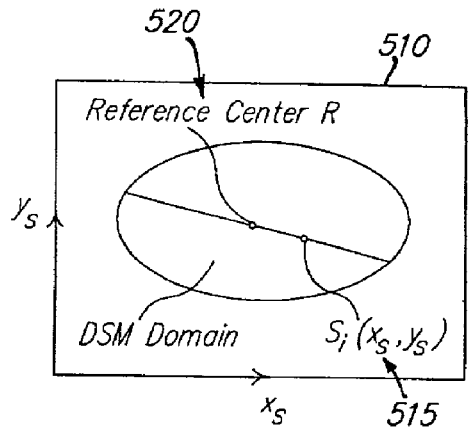
Figure 5C:
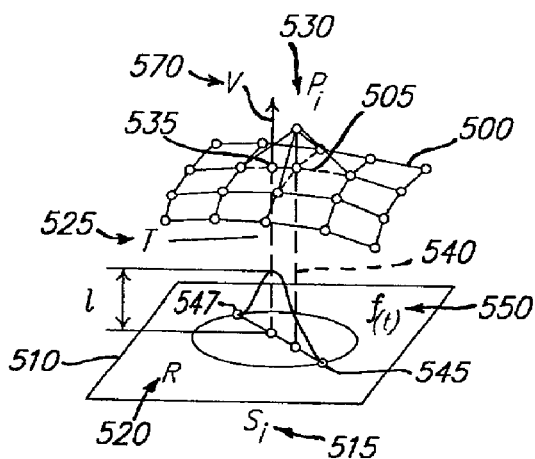

In block 320, the methodology defines a domain of the DSM feature and reference geometry in the sketch plane 510. The domain is a mathematical representation of a closed curve and the boundary of the closed curve defines the area of the domain. The reference geometry is a subset of the domain representing an area of maximum displacement. An example of a reference geometry is an open curve or a single point. As illustrated in FIG. 5b, a point defined as a reference center R shown at 520 is located within the domain of the sketch plane 510. A control vector T is centered at R and used to define a height of the feature in object space is shown at 525 in FIG. 5c. Preferably, the user 26 defines the domain and reference geometry using a process referred to in the art as sketching. The methodology advances to block 325.

In block 325, the methodology parameterizes an I-th vertex of the mesh, referred to as $P_i$ 530 as shown at 505 onto the sketch plane 510. For example, using a technique referred to in the art as parallel projection, $P_i$ 530 in the form of xyz Cartesian coordinates $x_i, y_i, z_i$ is projected to the interior of the domain of the DSM feature to obtain its $x_{si}, y_{si}$ coordinates as shown at 515. A ray starting from R and passing through the projected point 515 is constructed as shown at 540. The ray will intersect with the domain. The intersection points, shown at 545 and 547, define a line segment shown at 550, which can be parameterized by a single parameter t. Preferably, the domain of t is normalized between 0–1 for mapping a basis function f(t). The methodology advances to block 330.

In block 330, the user 26 specifies a maximum displacement V shown at 570 and a basis function f(t) to determine the displacement of $P_i$ 530. The basis function f(t) is mapped to a line segment bounded by the two intersection points 545, 547. As such, the new location of $P_i$ is the summation of the previous location and the displacement V multiplied by the basis function f(t) as follows:

$$\overline{P}_i = P_i + Vf(t(x_s(x_{pi}, y_{pi}, z_{pi}), y_s(x_{pi}, y_{pi}, z_{pi})))$$

Figure 5D:
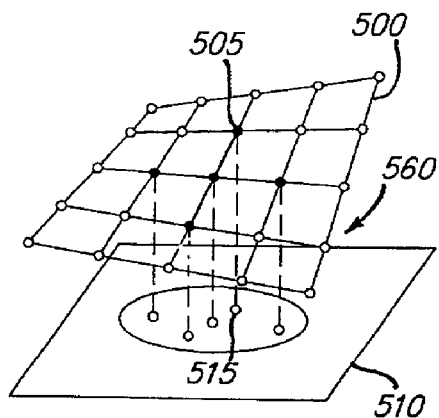

It should be appreciated that the basis function provides for simultaneous modification of all vertices of the triangles within the domain in a direct, intuitive, and controllable manner as illustrated in FIG. 5d at 560. Further, the user 26 can isolate a region on the mesh model and modification is only made to the interior of the region. In addition, transition from the modified region to the remainder is directly controlled by the application of the basis function. The methodology advances to block 335.

Figure 5E:
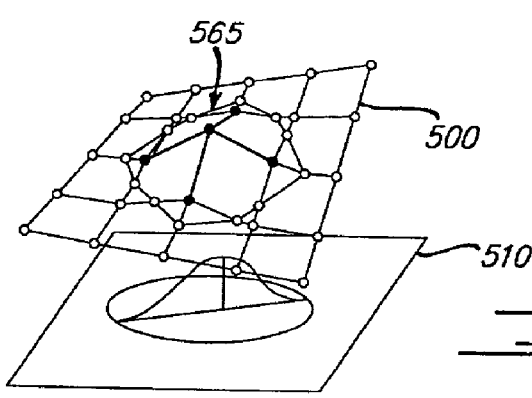

In block 335, the methodology calculates displacements for all mesh vertices projected within a domain for a feature using the basis function. The methodology advances to block 340. In block 340, the vertices are moved to their new position as shown at 565 in FIG. 5e. The methodology advances to diamond 345.

In diamond 345, the user 26 determines whether to continue modifying the mesh model. If the user 26 determines not to continue, the methodology advances to block 350. In block 350, the modified mesh model is available for additional use. In one embodiment, the mesh may be refined by decomposing a mesh element lying across the boundary of a feature or inside a feature. This provides a more rational representation of the original mesh model and the new features. In another embodiment, the feature is further manipulated, such as by relocating or modifying. In yet another embodiment, the DSM feature is separated from the original mesh and stored in a DSM feature data sub-library within the vehicle library 14. The DSM feature sub-library contains information relevant to the DSM feature, such as position, orientation, and definition. By combining the DSM feature with the original model of the mesh, the same mesh model is automatically created. This storage provision provides for repeatability of the analysis and can be used for archiving features as a template for later use or for use with another mesh model. The methodology advances to bubble 300 and returns to block 230 of FIG. 3.

Returning to diamond 345, if the user 26 determines to continue, the user 26 modifies a parameter and the methodology continues. For example, if the user 26 determines to modify the sketch plane, the methodology advances to block 355 and the user 26 modifies the sketch plane. The methodology then returns to block 315 and continues. If the user 26 determines to modify the domain and reference geometry, the methodology advances to block 360 and the user 26 modifies the domain and reference geometry. The methodology then returns to block 325 and continues. If the user 26 determines to modify the projection method, the methodology advances to block 365 and the user 26 modifies the projection method. The methodology then returns to block 320 and continues. If the user 26 determines to modify the basis function parameters or the maximum displacement, the methodology advances to block 370 and the user 26 modifies the maximum displacement or basis function. The methodology then returns to block 330 and continues.

Referring to FIG. 6, another embodiment, according to the present invention, of a method for design of experiments of a CAE mesh model using an automatically generated DOE model is illustrated. It should be appreciated that the embodiment is used with the methodology of FIG. 3 and assumes that a base mesh and feature meshes are stored in a computer database, such as the vehicle library 14 previously described. The methodology begins in bubble 400 and advances to block 405.

In block 405, the user 26 selects the automatic DOE generator option for importing a model. The methodology advances to block 410. In block 410, the user 26 selects a base mesh model for feature application. It should be appreciated that the user 26 can select a base mesh of a model for DOE analysis from the vehicle library 14 maintained in the computer system 22. The methodology advances to block 415.

In block 415, the user 26 selects a DSM feature from a DSM feature library maintained in the computer system 22. Preferably, the DSM feature library is a sub-library of the vehicle library 14 containing information relevant to a particular DSM feature, such as position, orientation, and definition of a feature. The methodology advances to block 420.

In block 420, the user 26 specifies a DSM feature and a base mesh to be combined into a mesh model for use in the DOE analysis. For example, the user 26 may select from a list of DSM features displayed on the display device 24b and using the input device 24c, such as a mouse, by pointing to a desired DSM feature and clicking on it. Advantageously, the user 26 specifies how to combine a set of DSM features for a particular DOE analysis. Since the DSM features are saved in a computer database, the user 26 can specify a predetermined combination of DSM features with a base model for each creation of the DOE analysis. The methodology advances to block 425.

In block 425, the methodology uses the selected DSM features and base model to generate a new mesh model. Advantageously, the automatic creation of a mesh model is a time and cost savings since it provides for repeatability of a particular creation of the DOE analysis and the use of a DSM feature as a template in additional analysis. The mesh model is imported into the DOE analysis in block 215 of FIG. 3 and the methodology continues.

The present invention has been described in an illustrative manner. It is to be understood that the terminology, which has been used, is intended to be in the nature of words of description rather than of limitation.

Many modifications and variations of the present invention are possible in light of the above teachings. Therefore, within the scope of the appended claims, the present invention may be practiced other than as specifically described.

The invention claimed is:

1. A method for design of experiments using direct surface manipulation of a mesh model, said method comprising the steps of:

selecting a geometric model, wherein the model is in a computer-aided design (CAD) format;

converting the geometric model into a mesh model;

evaluating the mesh model using a computer-aided engineering (CAE) analysis;

determining whether to continue generating the design of experiments response;

modifying a surface of the mesh model by varying a predetermined parameter, wherein the surface is modified using direct surface manipulation (DSM) by defining a sketch plane containing a domain of a DSM feature, positioning the sketch plane relative to the surface of the model, locating a reference center within the domain, projecting a vertex located on the surface of the mesh model into the domain of the sketch plane, specifying a maximum displacement of the DSM feature by locating a reference vector centered at the reference center to define the height of the DSM feature in object space, specifying a basis function to determine a displacement of the vertex, determining a displacement of the vertex relative to the DSM feature using the basis function, and using the displacement of the vertex to modify the surface of the mesh model, the mesh model is updated and the updated mesh model is used in continuing generating the design of experiments response, if determined to continue generating the design of experiments response; and using the results of the CAE analysis for the design of experiments.

2. A method as set forth in claim 1 wherein said step of evaluating the mesh model using CAE includes using computational fluid dynamics (CFD).

3. A method as set forth in claim 1 including the step of selecting a mesh model stored in a memory of the computer system.

4. A method as set forth in claim 1 including the step of separating the surface feature modified using DSM from the mesh model and storing the DSM feature within an electronic database in the memory of the computer system.

5. A method as set forth in claim 1 including the step of modifying the deformation of a local area of the surface by changing a DSM feature parameter.

6. A method as set forth in claim 1 including the step of refining the number of elements of a surface feature modified using DSM.

7. A method as set forth in claim 3 wherein said step of selecting a CAD model and converting the CAD model into a mesh model includes the steps of:
  selecting a base mesh model from an electronic database stored in the memory of the computer system;
  selecting a DSM feature from an electronic database stored in the memory of the computer system; and
  generating a mesh model using the base mesh model and the selected DSM feature.

8. A method as set forth in claim 3 wherein said step of selecting a CAD model and converting the CAD model into a mesh model includes the steps of selecting a DSM feature from an electronic database stored in the memory of the computer system and generating a mesh model using the converted mesh model and the selected DSM feature.

9. A method for design of experiments using direct surface manipulation of a mesh model, said method comprising the steps of:
  selecting a base mesh model from an electronic database stored in the memory of the computer system;
  selecting a DSM feature from an electronic database stored in the memory of the computer system;
  generating a mesh model using the base mesh model and the selected DSM feature;
  evaluating the mesh model using a computer-aided engineering (CAE) analysis;
  determining whether to continue generating the design of experiments response;
  modifying a surface of the mesh model by varying a predetermined parameter,
wherein the surface is modified using direct surface manipulation (DSM) by defining a sketch plane containing a domain of a DSM feature, positioning the sketch plane relative to the surface of the model, locating a reference center within the domain, projecting a vertex located on the surface of the model into the domain of the sketch plane, specifying a maximum displacement of the DSM feature by locating a reference vector centered at the reference center to define the height of the DSM feature in object space, specifying a basis function to determine a displacement of the vertex, determining a displacement of the vertex relative to the DSM feature using the basis function, and using the displacement of the vertex to modify the surface of the mesh model, the mesh model is updated and the updated mesh model is used in continuing generating the design of experiments response, if determined to continue generating the design of experiments response; and
  using the results of the CAB analysis for the design of experiments response.

10. A method as set forth in claim 9 wherein said step of evaluating the mesh model using CAB includes using computational fluid dynamics (CFD).

11. A method as set forth in claim 9 including the step of separating the surface feature modified using DSM from the mesh model and storing the DSM feature within an electronic database in the memory of the computer system.

12. A method as set forth in claim 9 including the step of modifying the deformation of a local area of the surface by changing a DSM feature parameter.

13. A method as set forth in claim 9 including the step of refining the number of elements of a surface feature modified using DSM.

* * * * *